(12) United States Patent
Kushihara et al.

(10) Patent No.: US 11,984,327 B2
(45) Date of Patent: May 14, 2024

(54) METHOD FOR PRODUCING POWER MODULE, AND POWER MODULE

(71) Applicant: SHIN-ETSU CHEMICAL CO., LTD., Tokyo (JP)

(72) Inventors: Naoyuki Kushihara, Annaka (JP); Kazuaki Sumita, Annaka (JP); Masahiro Kaneta, Annaka (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 260 days.

(21) Appl. No.: 17/400,193

(22) Filed: Aug. 12, 2021

(65) Prior Publication Data

US 2022/0068667 A1 Mar. 3, 2022

(30) Foreign Application Priority Data

Aug. 28, 2020 (JP) ................................. 2020-144661

(51) Int. Cl.
*H01L 23/29* (2006.01)
*H01L 21/56* (2006.01)
(Continued)

(52) U.S. Cl.
CPC ............ *H01L 21/565* (2013.01); *H01L 23/24* (2013.01); *H01L 23/3121* (2013.01)

(58) Field of Classification Search
CPC ....... H01L 21/56; H01L 21/565; H01L 21/24; H01L 21/28; H01L 23/24; H01L 23/28
(Continued)

(56) References Cited

U.S. PATENT DOCUMENTS 6,200,830 B1 * 3/2001 Ito ........................ H01L 21/563
257/E21.503
6,326,240 B1 12/2001 Liaw
(Continued)

FOREIGN PATENT DOCUMENTS

EP 3 760 408 A1 1/2021
JP 2012-079914 A 4/2012
(Continued)

OTHER PUBLICATIONS

Jan. 27, 2022 Extended European Search Report issued in European Application No. 21190996.5.
(Continued)

*Primary Examiner* — Nitin Parekh
(74) *Attorney, Agent, or Firm* — Oliff PLC

(57) ABSTRACT

The present invention is a method for producing a power module, including processes (1) to (4) in the following order: (1) a disposition process of disposing a thermosetting resin composition that is solid at 25° C. into a container housing an insulator substrate with multiple semiconductor components mounted thereon; (2) a melt process involving disposing the container having the thermosetting resin composition disposed therein into a molding apparatus capable of heating, pressurization, and depressurization, and heating the container to melt the thermosetting resin composition; (3) a pressurization-depressurization process of performing one or more depressurizations and one or more pressurizations inside the molding apparatus; and (4) a cure process of heating the inside of the molding apparatus to cure the thermosetting resin composition. This is to provide a method for producing a power module having few voids at the time of molding and excellent reliability.

18 Claims, 1 Drawing Sheet

(51) Int. Cl.
*H01L 23/24* (2006.01)
*H01L 23/31* (2006.01)
(58) Field of Classification Search
USPC .................................................. 438/112, 127
See application file for complete search history.

(56) References Cited

U.S. PATENT DOCUMENTS

| | | | | |
|---|---|---|---|---|
| 6,495,260 | B1* | 12/2002 | Takasaki | ............... H01L 23/293 |
| | | | | 241/24.1 |
| 7,157,311 | B2* | 1/2007 | Meguro | ............. H01L 21/4846 |
| | | | | 438/460 |
| 7,501,711 | B2* | 3/2009 | Eto | ...................... C08G 59/621 |
| | | | | 428/413 |
| 8,922,031 | B2* | 12/2014 | Toyoda | .................. C09J 163/00 |
| | | | | 524/502 |
| 2002/0151106 | A1* | 10/2002 | Noro | ....................... H01L 24/29 |
| | | | | 257/E21.503 |
| 2003/0089974 | A1 | 5/2003 | Matsuo et al. | |
| 2005/0154152 | A1* | 7/2005 | Toyoda | ................ C08G 59/621 |
| | | | | 525/481 |
| 2012/0080800 | A1 | 4/2012 | Shinohara | |
| 2021/0269583 | A1* | 9/2021 | Otsu | ....................... B32B 21/10 |

FOREIGN PATENT DOCUMENTS

| | | |
|---|---|---|
| JP | 5148175 B2 | 2/2013 |
| JP | 2015-216229 A | 12/2015 |
| JP | 2020-035965 A | 3/2020 |
| WO | 2019/189464 A1 | 10/2019 |

OTHER PUBLICATIONS

Jul. 4, 2023 Office Action issued in Japanese Patent Application No. 2020-144661.

* cited by examiner

[FIG. 1]
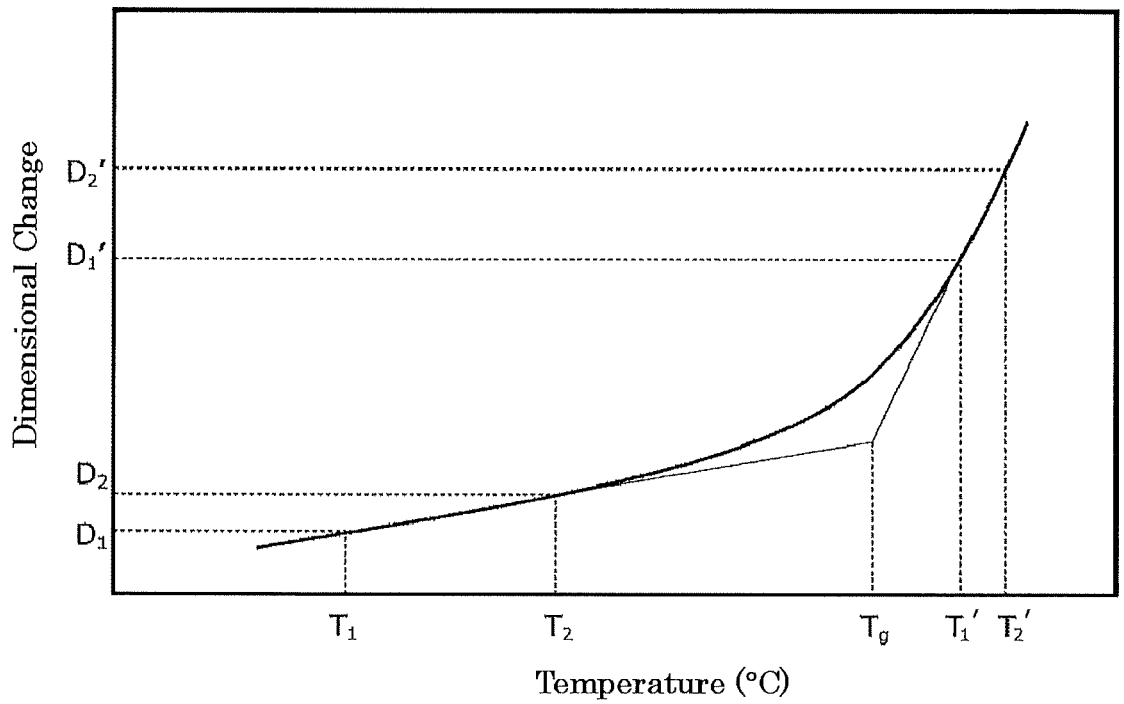
[FIG. 2]
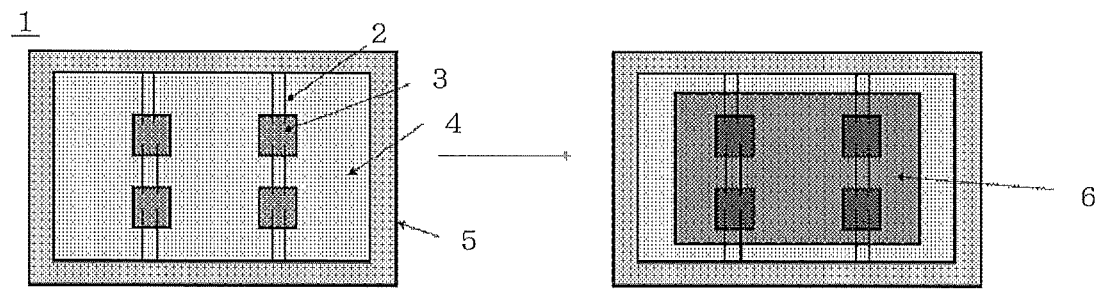
[FIG. 3]
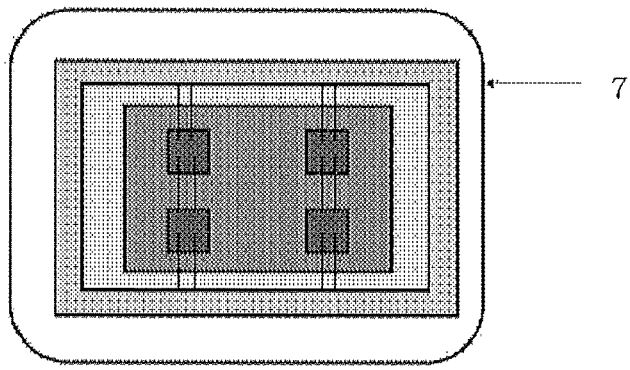

METHOD FOR PRODUCING POWER MODULE, AND POWER MODULE

TECHNICAL FIELD

The present invention relates to a method for producing a power module, and a power module.

BACKGROUND ART

In recent years, power modules have been used in various fields including hybrid vehicle, electric vehicle, railway, power generator, etc. Recently, there are increasing demands for power modules having higher performances such as higher rated voltage and rated current, and wider operating-temperature range.

As a package structure for power module, there is a structure in which a power semiconductor component(s) are mounted on a base plate for heat dissipation with an insulator substrate interposed therebetween, and a casing adheres to the base plate. As an encapsulant member of a power module, silicone gel is generally used (Patent Document 1).

However, such silicone gel has insufficient heat resistance in the application in recent high-temperature environment, so that the gel is hardened and cracked. Further, breakdown of the silicone gel causes low-volatile component and bubbles, so that the silicone gel separates from the insulator substrate. These result in a problem of lowering the insulation reliability of the power module.

To solve the problems, a liquid epoxy resin has been considered as an alternative encapsulant material in place of silicone gel (Patent Document 2). Generally, such liquid epoxy resin used as an encapsulant material of a power module is blended with a large amount of inorganic filler to have a linear expansion coefficient as close as that of the insulator substrate. This is to suppress warpage after the encapsulation.

The resulting liquid epoxy resin has high viscosity. This brings about problems that voids are not completely eliminated after the encapsulation, causing cracking and separation.

Meanwhile, the resin used in liquid epoxy resin generally contains CMR substances (carcinogenic, mutagenic, and reprotoxic substances). The use may be restricted in EU, where environmental concerns are high.

CITATION LIST

Patent Literature

Patent Document 1: JP 2012-79914 A
Patent Document 2: JP 2020-35965 A

SUMMARY OF INVENTION

Technical Problem

Accordingly, an object of the present invention is to provide a method for producing a power module having few voids at the time of molding and excellent reliability.

Solution to Problem

To achieve the object, the present invention provides a method for producing a power module, comprising processes (1) to (4) in the following order:

(1) a disposition process of disposing a thermosetting resin composition that is solid at 25° C. into a container housing an insulator substrate with a plurality of semiconductor components mounted thereon;

(2) a melt process involving
   disposing the container having the thermosetting resin composition disposed therein into a molding apparatus capable of heating, pressurization, and depressurization, and
   heating the container to melt the thermosetting resin composition;

(3) a pressurization-depressurization process of performing one or more depressurizations and one or more pressurizations inside the molding apparatus; and (4) a cure process of heating the inside of the molding apparatus to cure the thermosetting resin composition.

Such a production method makes it possible to provide a power module having no voids, cracks, etc. at the time of molding, and being excellent in reliability and free of CMR substances.

In this event, the heating in the melt process (2) is preferably performed at a temperature that is 200° C. or less but equal to or higher than a melting point or softening point of the thermosetting resin composition.

Such temperatures can keep the viscosity low to prevent voids or incomplete filling, and does not cause the thermosetting resin composition to be cured. This consequently enables elimination of internal voids and surface voids, if any.

Moreover, in this event, the heating in the melt process (2) is preferably performed with a rate of temperature rise at 0.5° C./minute to 50° C./minute.

With such rate of temperature rise, the resin would not thicken and can melt completely.

Further, the pressurization-depressurization process (3) preferably repeats the depressurization and/or the pressurization twice or more.

Effective removal of internal voids and surface voids is possible by repeating the depressurization and/or the pressurization multiple times.

Furthermore, the pressurization step of the pressurization-depressurization process (3) is preferably performed to 0.1 MPa to 10 MPa.

With such a range, the resin sufficiently enters narrow portions without leaving surface voids unfilled, and also the resin never overflows.

Additionally, the depressurization step of the pressurization-depressurization process (3) is preferably performed to 670 Pa to 90,000 Pa.

With such a range, the thermosetting resin composition does not overflow, while the defoaming effect by the depressurization is sufficient.

Furthermore, the depressurization step of the pressurization-depressurization process (3) is preferably performed from atmospheric pressure to a predetermined depressurization degree at a depressurization rate of 100 to 60,000 Pa/second.

With such a range, the thermosetting resin composition will not thicken or overflow.

Moreover, the thermosetting resin composition is preferably disposed in the disposition process (1) to cover an area accounting for 30% to 95% of an encapsulation area.

With such a coverage, incomplete filling and resin leakage will not occur.

Further, the present invention provides a power module comprising a cured product of a thermosetting resin composition for encapsulation, wherein the number of internal voids with a diameter of 100 μm or more is no more than 10/cm$^3$ in the cured product.

Such a power module has no voids or cracks and is excellent in reliability.

Advantageous Effects of Invention

As described above, the inventive production method makes it possible to obtain a power module that has no voids, cracks, etc. at the time of molding, and is excellent in reliability and free of CMR substances.

BRIEF DESCRIPTION OF DRAWINGS

FIG. 1 is an exemplary graph on which a relationship between dimension and temperature is plotted based on the result of measuring dimensional changes of test pieces at from 25° C. to 300° C., the graph illustrating a method for determining a glass transition temperature;

FIG. 2 illustrates a disposition process of disposing a thermosetting resin composition, which is solid at 25° C., into a container housing an insulator substrate with multiple semiconductor components mounted thereon; and FIG. 3 illustrates a step of disposing the container having the thermosetting resin composition disposed therein into a molding apparatus capable of heating, pressurization, and depressurization.

DESCRIPTION OF EMBODIMENTS

As noted above, there have been demands for a method for producing a power module which has no voids, cracks, etc. at the time of molding, and which is excellent in reliability and free of CMR substances.

The present inventors have earnestly studied to achieve the above object and consequently found that a power module excellent in reliability and free of voids and cracks on the surface and inside of a resin is provided by a production scheme including steps of: disposing a thermosetting resin composition, which is solid at 25° C., into a container containing an insulator substrate provided with multiple semiconductor components; disposing the container containing the resin composition disposed therein into a mold vessel capable of heating, pressurization, and depressurization; heating the container to melt the resin composition; depressurizing and pressurizing the inside of the mold vessel after the resin is melted; and further heating the inside of the mold vessel to cure the resin. This finding has led to the completion of the present invention.

Specifically, the present invention is a method for producing a power module, comprising processes (1) to (4) in the following order:

(1) a disposition process of disposing a thermosetting resin composition that is solid at 25° C. into a container housing an insulator substrate with a plurality of semiconductor components mounted thereon;

(2) a melt process involving
disposing the container having the thermosetting resin composition disposed therein into a molding apparatus capable of heating, pressurization, and depressurization, and
heating the container to melt the thermosetting resin composition;

(3) a pressurization-depressurization process of performing one or more depressurizations and one or more pressurizations inside the molding apparatus; and (4) a cure process of heating the inside of the molding apparatus to cure the thermosetting resin composition.

Hereinafter, the present invention will be described in detail, but the present invention is not limited thereto.
[Method for Producing Power Module]
(1) Disposition Process The production method according to the present invention includes a disposition process (1) of disposing a thermosetting resin composition, which is solid at 25° C., into a container housing an insulator substrate with multiple power semiconductor components mounted thereon. The container for the disposition may include a casing, mold, or the like, made of a thermoplastic resin, such as polyphenylene sulfide (PPS) resin, polybutylene terephthalate (PBT) resin, or polyethylene naphthalate (PEN) resin. FIG. 2 shows the details.

In FIG. 2, a container 1 configured to house an insulator substrate with multiple semiconductor components mounted thereon includes a container 5 and an insulator substrate 4 located therein. Power semiconductor components 3 and bonding wires 2 are provided on the insulator substrate 4. In the disposition process (1), a thermosetting resin composition 6 is disposed onto the power semiconductor components 3 on the insulator substrate 4 in a casing, if any.

The thermosetting resin composition can be appropriately disposed on a location to be encapsulated.

Moreover, the thermosetting resin composition is disposed to cover an area accounting for preferably 30% to 95%, more preferably 40% to 90%, further preferably 45% to 85%, of the encapsulation area, from the viewpoints of resin filling performance, void reduction, and resin leakage prevention. When the thermosetting resin composition is disposed on 30% or more of the encapsulation area, there is little risk of incomplete filling. When the thermosetting resin composition is disposed on 95% or less of the area, resin leakage will not happen.

Note that when a casing, frame, or the like is present, the resin composition is preferably disposed therein.
(2) Melt Process In this process, the container having the thermosetting resin composition disposed therein is disposed into a mold vessel (molding apparatus) capable of heating, pressurization, and depressurization, and heated to melt the thermosetting resin composition. The temperature of the thermosetting resin composition being melted can be altered appropriately depending on the softening point or melting point of the thermosetting resin to be employed. Nevertheless, from the viewpoint of lowering the viscosity of the thermosetting resin composition, the temperature is preferably within a range between, both inclusive, 200° C. and the softening point or melting point of the thermosetting resin composition. As a lower temperature in this range, the temperature is more preferably higher by 20° C. or more than the softening point or melting point, and the temperature is further preferably higher by 30° C. or more than the softening point or melting point. As a higher temperature in the range, the temperature is more preferably 180° C. or less, further preferably 150° C. or less. When the heating temperature is equal to or higher than the melting point or softening point of the thermosetting resin composition, the viscosity is suppressed and does not cause voids or incomplete filling. When the heating temperature is 200° C. or lower, the thermosetting resin composition has no risk of curing, and can sufficiently remove internal voids and surface voids, if any.

FIG. 3 illustrates the disposition step into a mold vessel. The container 1 housing an insulator substrate provided with multiple semiconductor components on which the thermosetting resin composition 6 has been mounted is placed into a mold vessel 7.

The melt process is performed preferably at atmospheric pressure or in a pressurized atmosphere. Performing the melt process at atmospheric pressure or in a pressurized state enhances the wettability between the thermosetting resin composition and the insulator substrate provided with multiple semiconductor components, and the effect of reducing internal voids and surface voids is expected.

The rate of temperature rise in the heating of the melt process is not particularly limited, but is preferably 0.5° C./minute to 50° C./minute, more preferably 2.0° C./minute to 30° C./minute, further preferably 5.0° C./minute to 20° C./minute, from the viewpoints of shortening the molding time and suppressing increase in the viscosity of the thermosetting resin composition. When the rate is 0.5° C./minute or higher, there is a sufficient time until a predetermined temperature is reached, so that the resin has no risk of thickening. When the rate is 50° C./minute or lower, sufficient heat is transferred to the resin, so that the subsequent pressurization-depressurization process can start after the resin melts completely.

Moreover, in the melt process, the rate of temperature rise may be constant or vary while the temperature is being increased. Meanwhile, after a predetermined temperature is reached, the temperature may be maintained for a certain period to melt the thermosetting resin.

After the heating of the thermosetting resin composition is started, the melt process lasts for preferably 1 minute to 60 minutes, more preferably 2 minutes to 45 minutes, further preferably 4 minutes to 30 minutes.

(3) Pressurization-Depressurization Process

In this process, the container having the thermosetting resin composition disposed therein is depressurized and pressurized in the mold vessel. In the present invention, the depressurization step refers to a step of performing depressurization from atmospheric pressure to a desired depressurization degree, whereas the pressurization step refers to a step of performing pressurization from atmospheric pressure to a desired pressurization degree. Incidentally, the course of returning the pressurized or depressurized state to atmospheric pressure is not considered because the quality of a power module produced by the inventive production method is not influenced by this course.

Additionally, in the present invention, "atmospheric pressure" refers to the pressure inside the mold vessel which is in an equilibrium state with the pressure of a space outside the mold vessel, and specifically refers to a pressure of 1 atmospheric pressure atm=around 1013 hPa.

[Depressurization Step]

The depressurization degree in the depressurization may be set to 670 Pa to 90,000 Pa. From the viewpoint of suppressing void generation, the pressure is decreased to preferably 2,000 Pa to 50,000 Pa, more preferably 4,000 to 40,000 Pa. With 670 Pa or more, the thermosetting resin composition has no risk of overflowing from a casing. With 90,000 Pa or less, the defoaming effect by the depressurization is sufficient.

The depressurization rate from atmospheric pressure to a predetermined depressurization degree may be set to 100 to 60,000 Pa/second. To reduce internal voids, the depressurization rate is preferably 300 to 30,000 Pa/second, more preferably 500 to 10,000 Pa/second. The depressurization rate can be set in accordance with the performance of an instrument, etc. When the depressurization rate is 100 Pa/second or more, the depressurization degree is reached soon, and the thermosetting resin composition does not thicken, so that defoaming is carried out sufficiently. Meanwhile, when the depressurization rate is 60,000 Pa/second or less, the thermosetting resin composition has no risk of overflowing from a casing.

Herein, the depressurization rate can be expressed by the following equation.

Depressurization rate=(initial pressure−depressurization limiting pressure)/(time to reach depressurization limiting pressure)

(the unit of the pressure is Pa, and the unit of the time to reach is second.)

The atmosphere temperature in the depressurization step is not particularly limited, and can be set appropriately according to the kind of the thermosetting resin composition. Preferably, the temperature of the thermosetting resin composition throughout the depressurization step is the same as the temperature in the melt process.

The depressurization step can be performed not only once but also multiple times. In this case, after a predetermined depressurization degree is reached, the atmosphere may be opened approximately to atmospheric pressure, followed by a depressurization again until a predetermined depressurization degree is reached. In this case, the depressurization degree in the first depressurization step may be identical to or different from the subsequent depressurization degree(s). At least single depressurization step is performed, preferably the depressurization step is performed twice or more. Performing the depressurization step multiple times enables effective removal of internal voids and surface voids in the thermosetting resin composition.

In the depressurization step, after a predetermined depressurization degree is reached, this state may be maintained for a certain period. Such a depressurization degree is maintained for a period of preferably 2 seconds to 10 minutes, further preferably 5 seconds to 5 minutes.

[Pressurization Step]

The pressurization degree in the pressurization step is in a range of preferably 0.1 MPa to 10 MPa, more preferably 0.2 MPa to 5 MPa, further preferably 0.2 MPa to 3 MPa, from the viewpoint of suppressing void generation. With 0.1 M Pa or more, surface voids hardly remain, and the resin favorably enters narrow portions. With 10 M Pa or less, the resin does not flow excessively, and has no risk of overflowing from a casing.

The pressurization rate is not particularly limited, and is preferably 0.1 MPa/minute to 1.0 MPa/minute, further preferably 0.2 MPa/minute to 1.0 MPa/minute.

Herein, the pressurization rate can be expressed by the following equation.

Pressurization rate=(pressurization limiting pressure−initial pressure)/(time to reach pressurization limiting pressure)

(the unit of the pressure is Pa, and the unit of the time to reach is second.)

The atmosphere temperature in the pressurization step is not particularly limited, and can be set appropriately according to the kind of the thermosetting resin composition. Preferably, the temperature of the thermosetting resin composition throughout the pressurization step is the same as the temperature in the melt process.

The pressurization step can be performed not only once but also multiple times. In this case, after a predetermined pressurization degree is reached, the atmosphere may be opened approximately to atmospheric pressure, followed by a pressurization again until a predetermined pressurization degree is reached. In this case, the pressurization degree in the first pressurization step may be identical to or different from the subsequent pressurization degree(s). At least single pressurization step is performed, preferably the pressurization step is performed twice or more. Performing the pressurization step multiple times enables effective removal of internal voids and surface voids in the thermosetting resin composition.

In the pressurization step, after a predetermined pressurization degree is reached, this state may be maintained for a certain period. Such a pressurization degree is maintained for a period of preferably 5 minutes to 4 hours, further preferably 10 minutes to 2 hours.

The order of the depressurization step and the pressurization step is not particularly limited. Nevertheless, a power module having more excellent surface state and fewer internal voids can be obtained by performing the pressurization step after the depressurization step.

(4) Cure Process

In this process after the pressurization-depressurization process, the thermosetting resin composition in the mold vessel is further heated and cured.

The curing conditions in this event are not particularly limited. For example, when a thermosetting resin composition containing an epoxy resin is employed, the composition may be cured for a period of 1 hour to 12 hours after the temperature is increased to 150° C. to 250° C. Moreover, during the curing, the composition may be cured in a pressurized state of 0.1 MPa to 10 MPa. Further, after taken out from the mold vessel, the composition may be additionally cured by using a separate oven etc. As necessary, the air in the mold vessel may be replaced with an inert gas such as nitrogen gas before the curing.

[Thermosetting Resin Composition]

As the thermosetting resin composition used in the inventive method for producing a power module, a resin composition that is solid at 25° C. is employed. The solid thermosetting resin composition may be in any shape, such as powdery, granular, sheet, or pellet form. With a sheet or pellet form, voids are hardly generated while the resin is melted. Meanwhile, with a sheet or pellet form, it is more likely that heat is uniformly transferred to the resin during the heat-melting, so that the defoaming performance in the depressurization step is improved, and voids hardly remain on the surface and the inside.

As the thermosetting resin used in the thermosetting resin composition, generally known resins can be employed. Examples thereof include epoxy resin, maleimide resin, phenol resin, cyanate resin, polyamide resin, polyimide resin, etc. From the viewpoints of moldability and reliability as an encapsulant material, the composition preferably contains an epoxy resin, maleimide resin, or cyanate resin, and further preferably contains an epoxy resin.

The kind of the epoxy resin is not particularly limited, and generally known epoxy resins can be employed. Examples of the epoxy resins include bisphenol A type epoxy resins, bisphenol F type epoxy resins, bisphenol S type epoxy resins, phenol novolak type epoxy resins, cresol novolak type epoxy resins, bisphenol A novolak type epoxy resins, bisphenol F novolak type epoxy resins, stilbene type epoxy resins, triazine skeleton-containing epoxy resins, fluorene skeleton-containing epoxy resins, triphenol alkane type epoxy resins, biphenyl type epoxy resins, xylylene type epoxy resins, biphenyl aralkyl type epoxy resins, naphthalene type epoxy resins, dicyclopentadiene type epoxy resins, alicyclic epoxy resins, silicone-modified epoxy resins, butadiene-modified epoxy resins, diglycidyl ether compounds of polycyclic aromatics such as polyfunctional phenols and anthracene, phosphorus-containing epoxy resins obtained by introducing a phosphorus compound into the above-listed examples, etc. One of these can be used alone, or a combination of two or more thereof can be used.

The maleimide resin is not particularly limited and generally known maleimide resins can be employed, as long as the maleimide resins have one or more maleimide groups per molecule. Examples of the maleimide resins include 4,4-diphenylmethane bismaleimide, phenylmethanemaleimide, m-phenylene bismaleimide, 2,2-bis(4-(4-maleimidephenoxy)-phenyl)propane, 3,3-dimethyl-5,5-diethyl-4,4-diphenylmethane bismaleimide, 4-methyl-1,3-phenylene bismaleimide, 1,6-bismaleimide(2,2,4-trimethyl)hexane, 4,4-diphenyl ether bismaleimide, 4,4-diphenyl sulfone bismaleimide, 1,3-bis(3-maleimidephenoxy)benzene, 1,3-bis(4-maleimidephenoxy)benzene, novolak type maleimide compounds, biphenyl aralkyl type maleimides, dimer acid diamine type maleimides, prepolymers of these maleimide resins, prepolymers of maleimide resins and amine compounds, etc. One of these maleimide compounds or a mixture of two or more thereof can be used.

Among these, novolak type maleimide compounds and biphenyl aralkyl type bismaleimide compounds are preferable. When such maleimide compounds are used, the heat resistance tends to be further enhanced.

The cyanate resin is not particularly limited and generally known cyanate resins can be employed, as long as the cyanate resins have one or more cyanato groups per molecule. Examples of the cyanate resins include: bisphenol type cyanate esters, such as 1,1-bis(4-cyanatophenyl) ethane, bis(3-methyl-4-cyanatophenyl)methane, bis(3-ethyl-4-cyanatophenyl)methane, bis(3,5-dimethyl-4-cyanatophenyl)methane, 2,2-bis(4-cyanatophenyl)propane, 2,2-bis(4-cyanatophenyl)-1,1,1,3,3,3-hexafluoropropane, diallyl bisphenol A type cyanate ester, and diallyl bisphenol F type cyanate ester; biphenyl type cyanate esters, such as 2,2'-dicyanatobiphenyl, 4,4'-dicyanatobiphenyl, and 3,3',5,5'-tetramethyl-4,4'-dicyanatobiphenyl; cyanatobenzenes, such as 1,3-dicyanatobenzene, 1,4-dicyanatobenzene, 2-tert-butyl-1,4-dicyanatobenzene, 2,4-dimethyl-1,3-dicyanatobenzene, 2,5-di-tert-butyl-1,4-dicyanatobenzene, tetramethyl-1,4-dicyanatobenzene, and 1,3,5-tricyanatobenzene; cyanatonaphthalenes, such as 1,3-dicyanatonaphthalene, 1,4-dicyanatonaphthalene, 1,5-dicyanatonaphthalene, 1,6-dicyanatonaphthalene, 1,8-dicyanatonaphthalene, 2,6-dicyanatonaphthalene, 2,7-dicyanatonaphthalene, and 1,3,6-tricyanatonaphthalene; bis(4-cyanatophenyl)ether, 4,4'-(1,3-phenylenediisopropylidene)diphenylcyanate, bis(4-cyanatophenyl)thioether, and bis(4-cyanatophenyl)sulfone. One of these cyanate ester compounds or a mixture of two or more thereof can be used. Among these, preferable cyanate ester compounds are 1,1-bis(4-cyanatophenyl)ethane, diallyl bisphenol A type cyanate ester, and diallyl bisphenol F type cyanate ester. Further preferable are 1,1-bis(4-cyanatophenyl)ethane and diallyl bisphenol F type cyanate ester.

The thermosetting resin composition may contain a curing agent. The kind of the curing agent is not particularly limited, and generally known curing agents can be employed. Examples of the curing agents for an epoxy resin as the thermosetting resin include an amine-based curing agent, phenol-based curing agent, acid anhydride-based curing agent, thiol-based curing agent, etc. From the viewpoints of moldability and heat resistance, the curing agent is preferably a phenol-based curing agent.

Examples of the phenol-based curing agent include phenol novolak resins, naphthalene ring-containing phenol resins, aralkyl type phenol resins, triphenol alkane type phenol resins, biphenyl skeleton-containing aralkyl type phenol resins, biphenyl type phenol resins, alicyclic phenol resins, heterocyclic phenol resins, naphthalene ring-containing phenol resins, resorcinol type phenol resins, allyl group-containing phenol resins, bisphenol type phenol resins, such as bisphenol A type and bisphenol F type resins, etc. One of these can be used alone, or a combination of two or more thereof can be used.

When a phenol-based curing agent is used as the curing agent, the molar ratio of phenolic hydroxyl groups contained in the curing agent relative to 1 mol of epoxy groups contained in the epoxy resin is preferably 0.5 to 1.5, more preferably 0.8 to 1.2.

The thermosetting resin composition may contain a filler. The kind of the filler is not particularly limited, and generally known fillers can be employed. Examples of the fillers include: silicas, such as spherical silica, fused silica, and crystalline silica; inorganic nitrides such as silicon nitride, aluminum nitride and boron nitride; alumina, glass fibers, glass particles, etc. The composition preferably contains silica from the viewpoints of excellent reinforcing effect, suppressing warpage of the resulting cured product, etc. One of these can be used alone, or a combination of two or more thereof can be used.

The average particle size and shape of the filler are not particularly limited. The average particle size is preferably 0.1 to 40 μm, more preferably 0.5 to 40 μm. Note that, in the present invention, the average particle size is a value obtained as a mass average value $D_{50}$ (or median diameter) in the particle size distribution measurement by a laser beam diffraction method.

From the viewpoint of increasing fluidity of the thermosetting resin composition used in the present invention, a combination of inorganic filler groups whose particle size ranges differ from each other may be employed as the filler. In such a case, spherical silicas in a fine particle size range of 0.1 to 3 μm, a medium particle size range of 3 to 7 μm, and a coarse particle size range of 10 to 40 μm are preferably used in combination. As a result of combining these, it is more preferable that the average particle size of the filler is in a range of 0.5 to 40 μm. In order to further increase fluidity, it is preferable to use spherical silica having larger average particle size.

Moreover, to strengthen the bonding strength to the thermosetting resin, the filler which is surface-treated in advance with a coupling agent may be blended.

The filler is contained in an amount of preferably 10 to 1900 parts by mass, more preferably 100 to 900 parts by mass, particularly preferably 200 parts by mass to 850 parts by mass, relative to 100 parts by mass of a sum of the thermosetting resin and the curing agent.

The thermosetting resin composition may contain a curing accelerator. The kind of the curing accelerator is not particularly limited, and generally known curing accelerators can be employed.

Examples of the utilizable curing accelerators include phosphorus-based compounds, such as triphenylphosphine, tributylphosphine, tri(p-methylphenyl)phosphine, tri(nonylphenyl)phosphine, triphenylphosphine.triphenylborane, and tetraphenylphosphine.tetraphenylborate; tertiary amine compounds, such as triethylamine, benzyldimethylamine, α-methylbenzyldimethylamine, and 1,8-diazabicyclo[5.4.0]undecene-7; imidazole compounds, such as 2-methylimidazole, 2-phenylimidazole, and 2-phenyl-4-methylimidazole; peroxide, urea compounds, salicylic acid, etc.

The curing accelerator is contained in an amount of preferably 0.2 parts by mass to 10 parts by mass, more preferably 0.5 parts by mass to 5 parts by mass, relative to 100 parts by mass of the thermosetting resin.

The thermosetting resin composition can be blended with a flame retardant to enhance flame retardancy.

The flame retardant is not particularly limited, and known flame retardants can be employed. Examples of the retardants include phosphazene compounds, silicone compounds, talc supporting zinc molybdate thereon, zinc oxide supporting zinc molybdate thereon, aluminum hydroxide, magnesium hydroxide, molybdenum oxide, antimony trioxide, etc. One of these may be used singly, or two or more thereof may be used in combination. The flame retardant is blended in an amount of preferably 2 to 100 parts by mass, more preferably 3 to 50 parts by mass, relative to 100 parts by mass of the thermosetting resin.

The thermosetting resin composition can be blended with an ion-trapping agent to prevent ion impurities from lowering the reliability.

Such an ion-trapping agent is not particularly limited, and known ion-trapping agents can be employed. For example, it is possible to employ hydrotalcites, bismuth hydroxide compounds, rare earth oxides, etc. One of these may be used singly, or two or more thereof may be used in combination. The ion-trapping agent is blended in an amount of preferably 0.5 to 25 parts by mass, more preferably 1.5 to 15 parts by mass, relative to 100 parts by mass of the thermosetting resin.

The thermosetting resin composition can be blended with a coupling agent, such as silane coupling agent or titanate coupling agent, to enhance the adhesiveness between the filler and the thermosetting resin or the curing agent, and to enhance the adhesion to the insulator substrate. Particularly, a silane coupling agent is preferable.

Examples of such a coupling agent include: epoxy functional alkoxysilanes, such as γ-glycidoxypropyltrimethoxysilane, γ-glycidoxypropyl methyldiethoxysilane, and β-(3,4-epoxycyclohexyl)ethyltrimethoxysilane; amino functional alkoxysilanes, such as N-β-(aminoethyl)-γ-aminopropyltrimethoxysilane, γ-aminopropyltriethoxysilane, and N-phenyl-γ-aminopropyltrimethoxysilane; mercapto functional alkoxysilanes, such as γ-mercaptopropyltrimethoxysilane; amine functional alkoxysilane, such as γ-aminopropyltrimethoxysilane and N-2-(aminoethyl)-3-aminopropyltrimethoxysilane; etc.

The amount of the coupling agent blended for the surface treatment and the surface treatment method are not particularly limited, and may follow conventional methods. In addition, as mentioned above, the inorganic filler may be treated with the coupling agent in advance. Alternatively, when the resin components such as the thermosetting resin and the curing agent are kneaded with the filler, the coupling agent may be added for the surface treatment of the composition being kneaded.

The coupling material is blended in an amount of preferably 0.1 to 25 parts by mass, particularly preferably 0.5 to 20 parts by mass, relative to 100 parts by mass of the thermosetting resin. When the amount is 0.1 parts by mass or more, sufficient adhesion effect onto the substrate is obtained. Meanwhile, when the amount is 25 parts by mass or less, there is no fear of extremely lowering the viscosity or causing voids.

The thermosetting resin composition may contain a release agent. The release agent is not particularly limited, and generally known release agents can be employed. The release agent is blended so as to heighten mold-releasability at the time of molding. Examples of such release agents include natural waxes, such as carnauba wax and rice wax; and synthetic waxes, such as acid wax, polyethylene wax, and fatty acid ester. Carnauba wax is preferable from the viewpoint of mold-releasability.

The release agent is blended in an amount of preferably 0.05 to 15 parts by mass, more preferably 0.1 to 10 parts by mass, relative to 100 parts by mass of the thermosetting resin. When the blend amount is 0.05 parts by mass or more, sufficient mold-releasability will be obtained, and excessive load will not be generated during melt-kneading at the time of manufacture. When the blend amount is 15 parts by mass or less, there is no fear of oozing failure, adhesion failure, etc.

The thermosetting resin composition may contain a colorant. Examples of the colorant include known colorants, such as carbon black, organic dyes, organic pigments, titanium oxide, and colcothar. From the viewpoint of the dispersibility into the thermosetting resin, carbon black is desirable.

The colorant is blended in an amount of preferably 0.01 parts by mass to 10 parts by mass, more preferably 0.1 parts by mass to 5 parts by mass, relative to 100 parts by mass of the thermosetting resin.

The thermosetting resin composition can be blended with a defoamer to suppress foaming in the resin during the melt process and the pressurization-depressurization process.

Examples of the defoamer include known defoamers, such as polyether, polyester, higher alcohol, higher alcohol derivatives, fatty acid derivatives, metal soap, silicone oil, polysiloxane, wax, and mineral oil.

The defoamer is blended in an amount of preferably 0.01 parts by mass to 10 parts by mass, more preferably 0.01 parts by mass to 5 parts by mass, relative to 100 parts by mass of the thermosetting resin.

[Preparation Method for Thermosetting Resin Composition]

As the method for preparing the thermosetting resin composition used in the present invention, conventionally known methods can be employed as appropriate. In the preparation method, it is possible to use, for example, a hot roll, kneader, extruder, etc. The resulting thermosetting resin composition may be pulverized into a powder. Tablets or granules may be formed from the powder, or a sheet may be formed by using a pressing machine or T-die. From the viewpoint of void reduction at the time of molding, pellet or sheet form is preferable.

When the thermosetting resin composition is thus obtained in a sheet form, the thickness is preferably 1 to 20 mm, more preferably 2 to 10 mm. In a pellet form, the diameter is preferably 10 to 100 mm, more preferably 20 to 80 mm, while the length is preferably 0.5 to 50 mm, more preferably 1 to 40 mm.

[Physical Properties of Thermosetting Resin Composition]

The thermosetting resin composition has a viscosity at 120° C. of preferably 0.01 Pa·s to 500 Pa·s, further preferably 0.1 Pa·s to 300 Pa·s, particularly preferably 0.1 Pa·s to 100 Pa·s. In the present invention, the viscosity at 120° C. of the thermosetting resin composition refers to a value measured using a rheometer as described in JIS K 7244-10: 2005. As the rheometer, for example, HR-2 (manufactured by TA Instruments) is used.

The viscosity at 120° C. of the thermosetting resin composition becomes 10 times as high as the initial viscosity after preferably 5 to 60 minutes elapses, further preferably 10 to 60 minutes elapses. When the time is 5 minutes or more, the filling performance is not lowered, and there is no risk of generating internal voids and surface voids.

A cured product of the thermosetting resin composition has a glass transition temperature of preferably 120 to 250° C., further preferably 150 to 250° C. When the glass transition temperature is within the ranges, the power module has higher reliability with respect to heat resistance.

In the present invention, the glass transition temperature (Tg) refers to a value determined by TMA method. In the measurement according to the TMA method, a cured product obtained by curing the thermosetting resin composition is processed into 5×5×15 mm test pieces. Then, these test pieces are set in a thermal dilatometer TMA8140C (manufactured by Rigaku Corporation). Subsequently, a temperature raising program is set such that the rate of temperature rise is 5° C./minute, and the setting is adjusted to apply a constant load of 19.6 mN. Thereafter, dimensional changes of the test pieces between 25° C. and 300° C. are measured. The relationship between dimensional change and temperature are plotted on a graph (FIG. 1 shows an example of such graph). Based on the graph of dimensional change and temperature obtained in this manner, the glass transition temperature can be determined according to a method for determining a glass transition temperature to be described below.

As shown in FIG. 1, two arbitrary temperature points T1 and T2 are selected which are not higher than the temperature of the inflection point, and from which a tangent to a dimensional change-temperature curve can be drawn. Moreover, two arbitrary temperature points T1' and T2' are selected which are not lower than the temperature of the inflection point, and from which a tangent can be drawn similarly. The dimensional changes at T1 and T2 are respectively designated as D1 and D2. The dimensional changes at T1' and T2' are respectively designated as D1' and D2'. A temperature point where a straight line connecting the points (T1, D1) and (T2, D2) intersects with a straight line connecting the points (T1', D1') and (T2', D2') is defined as the glass transition temperature (Tg).

The cured thermosetting resin composition has an average thermal expansion coefficient at from 40° C. to 80° C. of preferably 3 ppm/° C. to 30 ppm/° C., more preferably 5 ppm/° C. to 25 ppm/° C. When the average thermal expansion coefficient is within this range, the semiconductor components and the insulator substrate only slightly differ from each other in thermal expansion ratio, making it possible to suppress warpage after the encapsulation. In the present invention, the average thermal expansion coefficient is an average value of linear expansion coefficients calculated based on the measurement result corresponding to the temperature range from 40° C. to 80° C., the measurement result being obtained through a thermomechanical analysis conducted on the cured product under the same conditions as in the glass transition temperature measurement.

The cured product of the thermosetting resin composition has a flexural modulus at 25° C. of preferably 5 GPa to 35 GPa, more preferably 10 GPa to 30 GPa. When the flexural modulus at 25° C. is 5 GPa or more, it is possible to suppress the separation between the insulator substrate and the thermosetting resin composition in reliability tests, such as heat cycle test and high-temperature standing test, so that power module failure can be suppressed. When the modulus at 25° C. is 35 GPa or less, there is such a trend that inherent stress from the cured product of the thermosetting resin composition can be effectively suppressed.

Note that after a cured product is prepared, the flexural modulus at 25° C. can be measured according to JIS K 6911: 2006.

[Power Module]

A power module according to the present invention includes: an insulator substrate bonded to a power semiconductor device; and a cured product of a thermosetting resin composition configured to encapsulate the insulator substrate.

Specific examples of the power semiconductor device include semiconductor devices (power semiconductor chips), such as IGBTs (insulated gate bipolar transistors), diodes, Si-based MOSFETs (metal-oxide-semiconductor field-effect transistors), SiC-based MOSFETs, and GaN-based FETs (gallium nitride field-effect transistors).

The insulator substrate according to the present invention refers to a substrate which is prepared from an insulating material and provided with a copper plate on one side or both sides thereof. The copper plate is provided so as to enhance the heat dissipation performance, and may have a metal pattern attached thereto and plated with gold, silver, nickel, or the like. The substrate has electric insulating property in a thickness direction. Specific examples of the insulating material include ceramics, such as alumina and silicon nitride. Meanwhile, the same cured product of the thermosetting resin composition as described above can be used.

The power module produced according to the inventive production method is a power module having excellent reliability but no voids, cracks, etc. Specifically, in the power module, the cured product of the thermosetting resin composition for encapsulation is characterized in that the number of internal voids with a diameter of 100 μm or more is no more than 10/cm$^3$, preferably no more than 5/cm$^3$, more preferably no more than 2/cm$^3$, in the cured product.

EXAMPLE

Hereinafter, the present invention will be more specifically described with reference to Examples and Comparative Examples. The present invention is not limited to the following Examples.

Examples 1 to 19 and Comparative Examples 1 to 4

[Preparation of Thermosetting Resin Composition]

A mixed thermosetting resin composition was obtained according to the formulation (parts by mass) shown in Table 1. The details of the components are as follows.

Epoxy resin 1: biphenyl type epoxy resin (YX-4000K: manufactured by Mitsubishi Chemical Corporation)

Epoxy resin 2: triphenol methane type epoxy resin (EPPN-501H: manufactured by Nippon Kayaku Co., Ltd.)

Curing agent: phenol novolak resin (BRG-555: manufactured by Aica Kogyo Co., Ltd.)

Curing accelerator: urea-based catalyst (U-CAT3513N: manufactured by San-Apro Ltd.)

Coupling agent: γ-glycidoxypropyl trimethoxysilane (product name: KBM403, manufactured by Shin-Etsu Chemical Co., Ltd.)

Fused silica: spherical fused silica with an average particle size of 14 μm (manufactured by TATSUMORI LTD.)

Colorant: carbon black (manufactured by Mitsubishi Chemical Corporation)

[Measurement of Softening Point]

The softening point of the prepared composition was measured according to JIS K 7234 (1986). Table 1 shows the result.

[Measurement of Viscosity]

The prepared thermosetting resin composition was measured using a rheometer (plate diameter: 25 mm, measurement frequency: 1 Hz) set at 120° C., and Table 1 shows the numerical value. Moreover, Table 1 shows the time at which the viscosity became 10 times as high as the initial viscosity.

[Preparation of Cured Product Sample]

A molded cured product was obtained by heating at 120° C. for 30 minutes and then at 180° C. for 1 hour to cure the thermosetting resin composition described in Table 1.

[Measurement of Glass Transition Temperature]

After the cured product obtained by curing the thermosetting resin composition was processed into 5×5×15 mm test pieces, these test pieces were set in a thermal dilatometer TMA8140C (manufactured by Rigaku Corporation). Then, the temperature raising program was set such that the rate of temperature rise was 5° C./minute, and the setting was adjusted to apply a constant load of 19.6 mN. Subsequently, the dimensional changes of the test pieces were measured at from 25° C. to 300° C. The relationship between dimensional change and temperature was plotted on a graph (FIG. 1 shows an example of the graph). From the graph showing the dimensional changes and the temperatures thus obtained, the glass transition temperature in Examples and Comparative Examples was determined by a determination method for a glass transition temperature described below.

As shown in FIG. 1, two arbitrary temperature points T1 and T2 were selected which are no higher than the temperature of the inflection point, and from which a tangent to the dimensional change-temperature curve is obtained. Further, two arbitrary temperature points T1' and T2' were selected which are no lower than the temperature of the inflection point, and from which a tangent is obtained similarly. The dimensional changes at T1 and T2 were respectively designated as D1 and D2. The dimensional changes at T1' and T2' were respectively designated as D1' and D2'. A temperature point where a straight line connecting the points (T1, D1) and (T2, D2) intersects with a straight line connecting the points (T1', D1') and (T2', D2') was determined as the glass transition temperature (Tg).

[Determination Method for Linear Expansion Coefficient (CTE1)]

The cured product was subjected to a thermomechanical analysis under the same conditions as in the glass transition temperature measurement. The linear expansion coefficient, designated as CTE1, was calculated based on the measurement result corresponding to the temperature range from 40° C. to 80° C.

[Measurement of Flexural Modulus]

Using the cured product, the flexural modulus was measured according to JIS K 6911: 2006.

TABLE 1

| | |
|---|---|
| Epoxy resin 1 | 49.3 |
| Epoxy resin 2 | 12.3 |
| Curing agent | 38.4 |
| Curing accelerator | 2 |
| Coupling agent | 1 |

TABLE 1-continued

| | |
|---|---|
| Fused silica | 416 |
| Colorant | 1 |
| Softening point | 80° C. |
| Viscosity at 120° C. | 10.2 Pa·s |
| Time until the viscosity at 120° C. increased 10-fold | 21 minutes |
| Glass transition temperature (Tg) | 180° C. |
| CTE1 | 18 ppm/° C. |
| Flexural modulus | 18 GPa |

Example 1

A container was prepared, which was provided with: a frame made of a polyphenylene sulfide (PPS) resin; and a DBC (direct bond copper) insulator substrate composed of 110 mm×90 mm copper plated with nickel and an insulating ceramic. On the insulator substrate, Si chips were die-bonded with solder and were wire-bonded using aluminum wires. The thermosetting resin composition described in Table 1 was disposed into the container to cover an area accounting for 95% of the encapsulation area. The container having the thermosetting resin composition disposed therein was disposed into a pressure oven. Then, the temperature inside the pressure oven was increased to 100° C. at a rate of 10° C./minute to thereby melt the composition. After the temperature reached 100° C., the inside of the pressure oven was depressurized to 50,000 Pa at a depressurization rate of 300 Pa/second. After the reaching 50,000 Pa, the pressure was maintained for 1 minute. Subsequently, the inside of the pressure oven was let to atmospheric pressure, and pressurized at 100° C. to 1.0 MPa at a rate of 0.1 MPa/minute. After reaching 1.0 MPa, the pressure was maintained for 10 minutes. Thereafter, while the inside of the pressure oven was pressurized at 1.0 MPa, the temperature was increased to 150° C. at a rate of 10° C./minute. After reaching 150° C., the temperature was maintained for 2 hours to heat-cure the thermosetting resin composition. In this manner, a power module was obtained.

Example 2

A power module was obtained as in Example 1, except that the thermosetting resin composition was disposed in the container to cover 30% of the encapsulation area.

Example 3

A power module was obtained as in Example 1, except that the thermosetting resin composition was melted by increasing the temperature inside the pressure oven to 100° C. with a rate of temperature rise at 0.5° C./minute.

Example 4

A power module was obtained as in Example 1, except that the thermosetting resin composition was melted by increasing the temperature inside the pressure oven to 100° C. with a rate of temperature rise at 30° C./minute.

Example 5

A power module was obtained as in Example 1, except that the thermosetting resin composition was melted by increasing the temperature inside the pressure oven to 180° C.

Example 6

A power module was obtained as in Example 1, except that the inside of the pressure oven was depressurized to 2,000 Pa.

Example 7

A power module was obtained as in Example 1, except that the inside of the pressure oven was depressurized at 100 Pa/second.

Example 8

A power module was obtained as in Example 1, except that the inside of the pressure oven was depressurized at 60,000 Pa/second.

Example 9

A power module was obtained as in Example 1, except that the inside of the pressure oven was pressurized to 0.2 MPa.

Example 10

A power module was obtained as in Example 1, except that the inside of the pressure oven was pressurized to 5 MPa.

Example 11

A power module was obtained as in Example 1, except that the thermosetting resin composition was disposed in the container to cover 20% of the encapsulation area.

Example 12

A power module was obtained as in Example 1, except that the thermosetting resin composition was melted by increasing the temperature inside the pressure oven to 100° C. with a rate of temperature rise at 0.3° C./minute.

Example 13

A power module was obtained as in Example 1, except that the thermosetting resin composition was melted by increasing the temperature inside the pressure oven to 100° C. with a rate of temperature rise at 60° C./minute.

Example 14

A power module was obtained as in Example 1, except that the thermosetting resin composition was melted by increasing the temperature inside the pressure oven to 60° C.

Example 15

A power module was obtained as in Example 1, except that the thermosetting resin composition was melted by increasing the temperature inside the pressure oven to 220° C.

Example 16

A power module was obtained as in Example 1, except that the inside of the pressure oven was depressurized to 300 Pa.

Example 17

A power module was obtained as in Example 1, except that the inside of the pressure oven was depressurized at 50 Pa/second.

Example 18

A power module was obtained as in Example 1, except that the inside of the pressure oven was depressurized at 75,000 Pa/second.

Example 19

A power module was obtained as in Example 1, except that the inside of the pressure oven was pressurized to 0.06 MPa.

Comparative Example 1

A power module was obtained as in Example 1, except for not involving the step of heating the inside of the pressure oven to melt the thermosetting resin composition.

Comparative Example 2

A power module was obtained as in Example 1, except for not involving the step of depressurizing the inside of the pressure oven.

Comparative Example 3

A power module was obtained as in Example 1, except for not involving the step of pressurizing the inside of the pressure oven.

Comparative Example 4

A power module was obtained as in Example 1, except for not involving the step of heating the inside of the pressure oven to cure the thermosetting resin composition.

[Evaluation of Surface Voids]

The presence or absence of surface voids in the power modules obtained in Examples 1 to 19 and Comparative Examples 1 to 4 was checked using an optical microscope. In Table 2, the results are shown as follows:

A indicates that the number of voids with a diameter of 100 μm or more in the surface was no more than 2/cm³;
  B indicates that the number of surface voids was 3 to 5/cm³;
  C indicates that the number of surface voids was 6 to 10/cm³; and
  D indicates that the number of surface voids was more than 10/cm³.

[Evaluation of Internal Voids]

The presence or absence of internal voids in the power modules obtained in Examples 1 to 19 and Comparative Examples 1 to 4 was checked using an ultrasonic inspection instrument. In Table 2, the results are shown as follows:

A indicates that the number of voids with a diameter of 100 μm or more inside the module was no more than 2/cm³;
  B indicates that the number of internal voids was 3 to 5/cm³;
  C indicates that the number of internal voids was 6 to 10/cm³; and
  D indicates that the number of internal voids was more than 10/cm³.

[Heat Cycle Test (Heat Resistance)]

The power modules obtained in Examples 1 to 19 and Comparative Examples 1 to 4 were subjected to a heat cycle test (the temperature was maintained at −65° C. for 30 minutes and then at 150° C. for 30 minutes. This cycle was repeated 1,000 times). After the heat cycle test, whether the thermosetting resin composition was separated from the DBC insulator substrate or not was checked using an ultrasonic inspection instrument. Out of a total of five molded articles prepared in each example, the number of molded articles from which the separation was observed was counted.

[Moisture Resistance Reliability Test]

The power modules obtained in Examples 1 to 19 and Comparative Examples 1 to 4 were subjected to a moisture resistance reliability test (exposed to an saturated water vapor environment in a pressure cooker at 121° C. and 2.03×10⁵ Pa for 48 hours). After the moisture resistance reliability test, whether the thermosetting resin composition was separated from the DBC insulator substrate or not was checked using an ultrasonic inspection instrument. Out of a total of five molded articles prepared in each example, the number of molded articles from which the separation was observed was counted.

TABLE 2

| | Example 1 | Example 2 | Example 3 | Example 4 | Example 5 | Example 6 | Example 7 | Example 8 | Example 9 | Example 10 | Example 11 | Example 12 |
|---|---|---|---|---|---|---|---|---|---|---|---|---|
| Surface Void Evaluation | A | A | B | A | B | B | B | A | B | A | C | C |
| Internal Void Evaluation | A | A | A | B | A | A | A | A | B | A | C | A |
| Heat Cycle Test | 0/5 | 0/5 | 1/5 | 0/5 | 0/5 | 1/5 | 1/5 | 0/5 | 1/5 | 0/5 | 2/5 | 2/5 |
| Moisture Resistance Reliability Test | 0/5 | 0/5 | 0/5 | 1/5 | 0/5 | 0/5 | 0/5 | 0/5 | 1/5 | 0/5 | 1/5 | 0/5 |

TABLE 2-continued

| | Example 13 | Example 14 | Example 15 | Example 16 | Example 17 | Example 18 | Example 19 | Comparative Example 1 | Comparative Example 2 | Comparative Example 3 | Comparative Example 4 |
|---|---|---|---|---|---|---|---|---|---|---|---|
| Surface Void Evaluation | C | C | C | C | B | C | C | D | D | D | D |
| Internal Void Evaluation | C | C | C | A | C | C | A | D | D | D | D |
| Heat Cycle Test | 1/5 | 2/5 | 1/5 | 2/5 | 1/5 | 3/5 | 3/5 | 4/5 | 3/5 | 5/5 | 5/5 |
| Moisture Resistance Reliability Test | 1/5 | 2/5 | 1/5 | 0/5 | 2/5 | 1/5 | 0/5 | 3/5 | 3/5 | 4/5 | 5/5 |

The comparison between Examples and Comparative Examples based on these results revealed that if any one of melting, depressurization, pressurization, and curing steps is not performed, voids and separation from the insulator substrate are observed, and power modules excellent in reliability are not obtained. Moreover, the following was revealed by the comparison between Examples 1 to 10 and Examples 11 to 19: in Examples 1 to 10, the encapsulation area, rate of temperature rise, heat-melting temperature, pressure targeted in the depressurization, depressurization rate, and pressure targeted in the pressurization were set within preferable ranges; whereas, in Examples 11 to 19, any one of these parameters was set outside the preferable range. Although the inventive power module was obtained in any Example, more favorable results were successfully obtained in Examples 1 to 10, in which all the parameters were set within preferable ranges.

It should be noted that the present invention is not limited to the above-described embodiments. The embodiments are just examples, and any examples that substantially have the same feature and demonstrate the same functions and effects as those in the technical concept disclosed in claims of the present invention are included in the technical scope of the present invention.

The invention claimed is:

1. A method for producing a power module, comprising processes (1) to (4) in the following order of steps:
   (1) a disposition process of disposing a thermosetting resin composition that is solid at 25° C. into a container housing an insulator substrate with a plurality of semiconductor components mounted thereon;
   (2) a melt process involving
      disposing the container having the thermosetting resin composition disposed therein into a molding apparatus capable of heating, pressurization, and depressurization, and
      heating the container to melt the thermosetting resin composition;
   (3) a pressurization-depressurization process of performing a depressurization step followed by a pressurization step inside the molding apparatus; and
   (4) a cure process of heating the inside of the molding apparatus to cure the thermosetting resin composition.

2. The method for producing a power module according to claim 1, wherein the heating in the melt process (2) is performed at a temperature that is 200° C. or less but equal to or higher than a melting point or softening point of the thermosetting resin composition.

3. The method for producing a power module according to claim 2, wherein the heating in the melt process (2) is performed with a rate of temperature rise at 0.5° C./minute to 50° C./minute.

4. The method for producing a power module according to claim 3, wherein the pressurization-depressurization process (3) repeats the depressurization step and/or the pressurization step twice or more.

5. The method for producing a power module according to claim 3, wherein the pressurization step of the pressurization-depressurization process (3) is performed to 0.1 MPa to 10 MPa.

6. The method for producing a power module according to claim 2, wherein the pressurization-depressurization process (3) repeats the depressurization step and/or the pressurization step twice or more.

7. The method for producing a power module according to claim 2, wherein the pressurization step of the pressurization-depressurization process (3) is performed to 0.1 MPa to 10 MPa.

8. The method for producing a power module according to claim 2, wherein the depressurization step of the pressurization-depressurization process (3) is performed to 670 Pa to 90,000 Pa.

9. The method for producing a power module according to claim 2, wherein the depressurization step of the pressurization-depressurization process (3) is performed from atmospheric pressure to a predetermined depressurization degree at a depressurization rate of 100 to 60,000 Pa/second.

10. The method for producing a power module according to claim 2, wherein the thermosetting resin composition is disposed in the disposition process (1) to cover an area accounting for 30% to 95% of an encapsulation area.

11. The method for producing a power module according to claim 1, wherein the heating in the melt process (2) is performed with a rate of temperature rise at 0.5° C./minute to 50° C./minute.

12. The method for producing a power module according to claim 11, wherein the pressurization-depressurization process (3) repeats the depressurization step and/or the pressurization step twice or more.

13. The method for producing a power module according to claim 11, wherein the pressurization step of the pressurization-depressurization process (3) is performed to 0.1 MPa to 10 MPa.

14. The method for producing a power module according to claim 1, wherein the pressurization-depressurization process (3) repeats the depressurization step and/or the pressurization step twice or more.

15. The method for producing a power module according to claim 1, wherein the pressurization step of the pressurization-depressurization process (3) is performed to 0.1 MPa to 10 MPa.

16. The method for producing a power module according to claim 1, wherein the depressurization step of the pressurization-depressurization process (3) is performed to 670 Pa to 90,000 Pa.

17. The method for producing a power module according to claim 1, wherein the depressurization step of the pressurization-depressurization process (3) is performed from atmospheric pressure to a predetermined depressurization degree at a depressurization rate of 100 to 60,000 Pa/second.

18. The method for producing a power module according to claim 1, wherein the thermosetting resin composition is disposed in the disposition process (1) to cover an area accounting for 30% to 95% of an encapsulation area.

* * * * *